United States Patent
Yoo (10) Patent No.: US 10,971,426 B2
(45) Date of Patent: Apr. 6, 2021

(54) SEMICONDUCTOR PACKAGE

(71) Applicant: Samsung Electronics Co., Ltd., Suwon-si (KR)

(72) Inventor: Jae Wook Yoo, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/411,191

(22) Filed: May 14, 2019

(65) Prior Publication Data

US 2020/0118992 A1 Apr. 16, 2020

(30) Foreign Application Priority Data

Oct. 11, 2018 (KR) .................. 10-2018-0121003

(51) Int. Cl.
| | |
|---|---|
| *H01L 23/40* | (2006.01) |
| *H01L 25/18* | (2006.01) |
| *H01L 23/00* | (2006.01) |
| *H01L 23/31* | (2006.01) |
| *H01L 23/34* | (2006.01) |
| *H01L 23/36* | (2006.01) |

(52) U.S. Cl.
CPC .......... *H01L 23/40* (2013.01); *H01L 23/3128* (2013.01); *H01L 23/34* (2013.01); *H01L 23/36* (2013.01); *H01L 24/17* (2013.01); *H01L 24/49* (2013.01); *H01L 24/73* (2013.01); *H01L 25/18* (2013.01); *H01L 2224/73257* (2013.01); *H01L 2924/1434* (2013.01)

(58) Field of Classification Search
CPC ......... H01L 23/12; H01L 23/13; H01L 23/16; H01L 23/18; H01L 23/24; H01L 23/28; H01L 23/29; H01L 23/31; H01L 23/3128; H01L 23/3142; H01L 23/562; H01L 23/564; H01L 24/10; H01L 24/12; H01L 24/15; H01L 23/34; H01L 23/36; H01L 23/367; H01L 23/3675; H01L 23/40; H01L 23/4037; H01L 23/4043; H01L 23/405; H01L 23/4062

See application file for complete search history.

(56) References Cited

U.S. PATENT DOCUMENTS

| | | | |
|---|---|---|---|
| 10,098,220 B2* | 10/2018 | Liang | .............. H05K 1/0203 |
| 2003/0085475 A1* | 5/2003 | Im | .............. H01L 23/16 |
| | | | 257/796 |
| 2003/0160312 A1 | 8/2003 | Lo et al. | |
| 2004/0262766 A1* | 12/2004 | Houle | .............. H01L 23/04 |
| | | | 257/758 |
| 2005/0104222 A1* | 5/2005 | Jeong | .............. H01L 23/16 |
| | | | 257/778 |

(Continued)

*Primary Examiner* — Eduardo A Rodela
(74) *Attorney, Agent, or Firm* — Muir Patent Law, PLLC (57) ABSTRACT

A semiconductor package is provided. The semiconductor package includes a first package comprising a first substrate and a first semiconductor chip, a second package arranged on the first package, and the second package comprising a second substrate and a second semiconductor chip, a first solder ball and a supporter layer arranged between the first package and the second package, and a dam arranged between the first package and the second package, the dam being in contact with a sidewall of the supporter layer, and the dam completely surrounding the sidewall of the supporter layer.

20 Claims, 10 Drawing Sheets

(56) References Cited

U.S. PATENT DOCUMENTS

| | | | |
|---|---|---|---|
| 2008/0137300 A1* | 6/2008 | Macris | H01L 24/32 |
| | | | 361/699 |
| 2009/0152713 A1* | 6/2009 | Sauciuc | H01L 23/3737 |
| | | | 257/713 |
| 2012/0074586 A1 | 3/2012 | Seo et al. | |
| 2012/0119380 A1* | 5/2012 | Haba | H01L 21/56 |
| | | | 257/774 |
| 2014/0084442 A1* | 3/2014 | Lee | H01L 23/34 |
| | | | 257/692 |
| 2014/0328016 A1* | 11/2014 | Crisp | G11C 5/063 |
| | | | 361/679.32 |
| 2014/0339708 A1 | 11/2014 | Jang et al. | |
| 2015/0228553 A1* | 8/2015 | Saeidi | H01L 23/16 |
| | | | 257/712 |
| 2015/0318266 A1* | 11/2015 | Jang | H01L 23/3735 |
| | | | 257/720 |
| 2016/0163683 A1 | 6/2016 | Yu et al. | |
| 2017/0018531 A1 | 1/2017 | Lin et al. | |
| 2017/0098592 A1* | 4/2017 | Jin | H01L 23/552 |
| 2017/0278830 A1* | 9/2017 | Kim | H01L 25/50 |
| 2017/0287796 A1 | 10/2017 | Lee et al. | |
| 2017/0317038 A1 | 11/2017 | Tsai et al. | |

* cited by examiner

SEMICONDUCTOR PACKAGE

This application claims the benefit of priority under 35 U.S.C. § 119 to Korean Patent Application No. 10-2018-0121003, filed on Oct. 11, 2018, the disclosure of which is incorporated herein by reference in its entirety.

BACKGROUND

1. Technical Field

The present disclosure relates to a semiconductor package.

2. Description of the Related Art

Demands in high performance, fast speed operation, and miniaturization of electronic elements are increasing with increased development of the electronic industry. In response to these demands, a method for stacking and populating several semiconductor chips on one package substrate or a method for stacking another package on a package may be used. For example, a package-in-package (PIP) type semiconductor package or a package-on-package (POP) type semiconductor package may be used.

SUMMARY

An object to be achieved by the present disclosure is to provide a semiconductor package which has a supporter layer arranged between an upper package and a lower package, and a dam arranged to surround the sidewall of the supporter layer, thereby reinforcing structural strength.

According to exemplary embodiments, the disclosure is directed to a semiconductor package comprising a first package comprising: a first substrate and a first semiconductor chip; second package arranged on the first package, the second package comprising a second substrate and a second semiconductor chip; a first solder ball and a supporter layer arranged between the first package and the second package; and a dam arranged between the first package and the second package, the dam being in contact with sidewalls of the supporter layer, wherein the dam completely surrounds the supporter layer, when viewed in plan view.

According to exemplary embodiments, the disclosure is directed to a semiconductor package comprising: a first package comprising a first semiconductor chip; a substrate arranged on the first package; a second package arranged on the substrate, the second package comprising a second semiconductor chip; a supporter layer arranged between the substrate and the second package; and a dam arranged between the substrate and the second package, the dam being in contact with a sidewall of the supporter layer, and the dam comprising a non-conductive material, wherein the dam completely surrounds the supporter layer, when viewed in plan view.

According to exemplary embodiments, the disclosure is directed to a semiconductor package comprising: a first package comprising a first substrate and a first semiconductor chip arranged on the first substrate; a second substrate arranged on the first package; a supporter layer arranged on the second substrate, the supporter layer having a width narrower than a width of the first package; a dam arranged on the second substrate, the dam being in contact with a sidewall of the supporter layer, and the dam completely surrounding the supporter layer, when viewed in plan view; and a solder ball arranged on the second substrate and the solder ball spaced apart from the dam.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

A semiconductor package according to some exemplary embodiments of the present disclosure relates to a fan out-panel level package package-on-package (FO-PLP POP), or an interposer package-on-package (POP). However, the present disclosure is not limited thereto. Hereinafter, a semiconductor package having a structure of a FO-PLP POP or an interposer POP according to some exemplary embodiments will be described by way of an example.

Hereinbelow, a semiconductor package according to some exemplary embodiments will be described with reference to FIG. 1 and FIG. 2.

Figure 1:
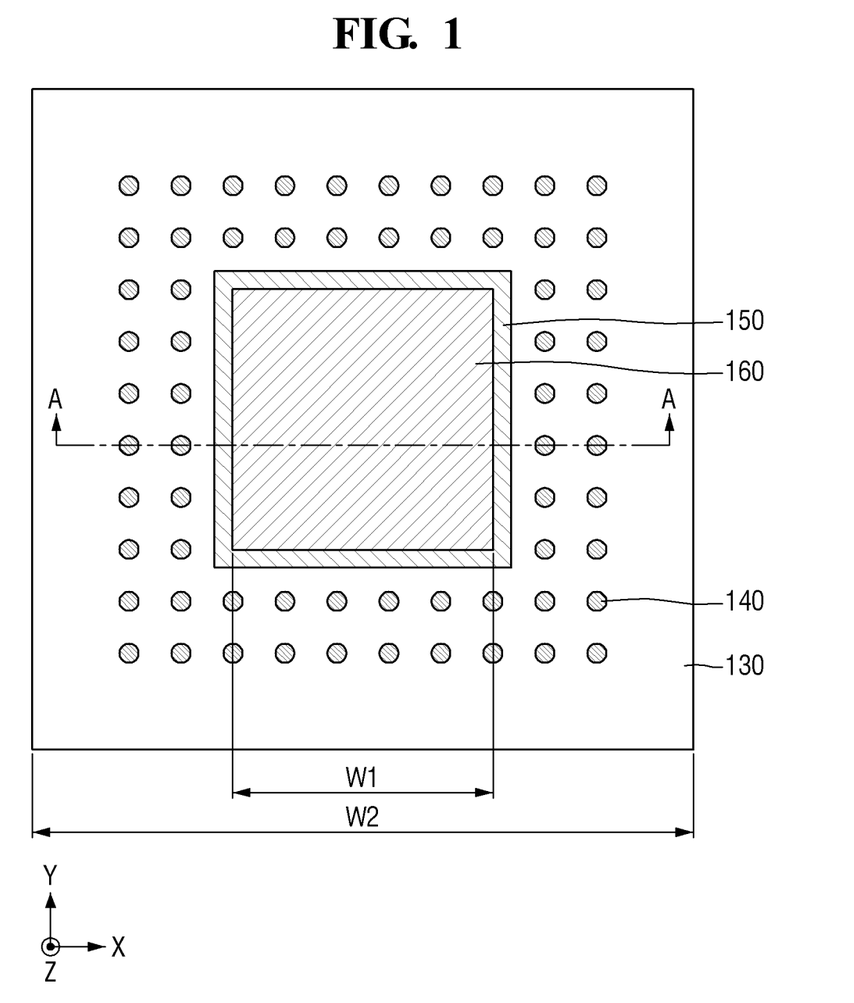
FIG. 1 is a top view provided to explain a semiconductor package according to some exemplary embodiments.

FIG. 1 is a top view provided to explain a semiconductor package according to some exemplary embodiments. FIG. 2 is a cross-sectional view taken on line A-A of FIG. 1. For convenience of explanation, a second package 120 is omitted from FIG. 1.

Figure 2:
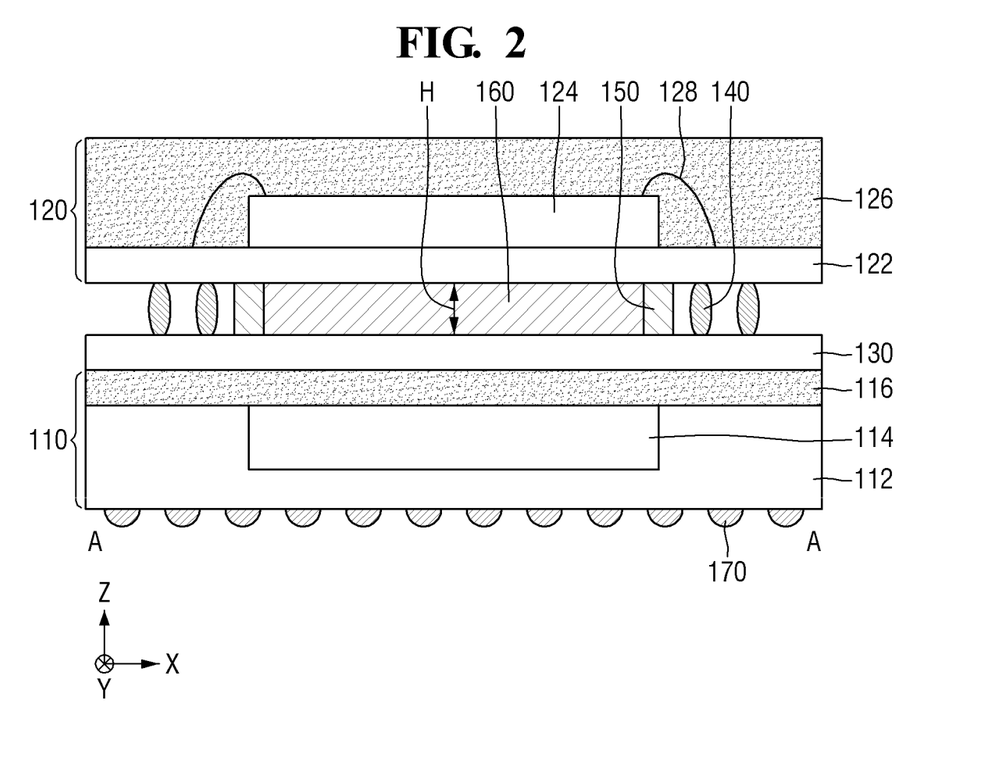
FIG. 2 is a cross-sectional view taken on line A-A of FIG. 1.

Referring to FIG. 1 and FIG. 2, the semiconductor package according to some exemplary embodiments includes a first package 110, a second package 120, a third substrate 130, first solder balls 140, a first dam 150, and a supporter layer 160.

The first package 110 may include a first substrate 112, a first semiconductor chip 114, a first molding layer 116, and a second solder ball 170.

The first substrate 112 may be, for example, a printed circuit board (PCB) or a ceramic substrate. However, the present disclosure is not limited thereto.

When the first substrate 112 is a PCB, the first substrate 112 may include at least one material selected from phenol resin, epoxy resin, and polyimide. For example, the first substrate 112 may include at least one material selected from FR4, tetrafunctional epoxy, polyphenylene ether, epoxy/polyphenylene oxide, bismaleimide triazine (BT), thermount, cyanate ester, polyimide, and liquid crystal polymer. A surface of the first substrate 112 may be covered by solder-resist, although the present disclosure is not limited thereto.

The first semiconductor chip 114 may be arranged to be buried inside the first substrate 112. The first semiconductor chip 114 may be formed at least partially below a top surface of first substrate 112, and the first substrate 112 may surround at least a portion of the first semiconductor chip 114. For example, the first package 110 may be an embedded package in which the first semiconductor chip 114 is arranged to be buried inside the first substrate 112. However, the present disclosure is not limited thereto. For example, in some other exemplary embodiments, the first semiconductor chip 114 may be arranged on the first substrate 112, and may be electrically connected with the first substrate 112 by using a solder ball arranged between the first semiconductor chip 114 and the first substrate 112.

The first semiconductor chip 114 may be any one of, for example, an application processor (AP), a power management integrated circuit (PMIC), a central processing unit (CPU), a controller, and an application specific integrated circuit (ASIC). However, the present disclosure is not limited thereto.

Although FIG. 2 depicts that one semiconductor chip is arranged inside the first substrate 112, this is for convenience of explanation, and the present disclosure is not limited thereto. For example, in some other exemplary embodiments, two or more semiconductor chips may be stacked on the first substrate 112 in a third direction Z. In addition, in some other exemplary embodiments, two or more semiconductor chips may be arranged on the first substrate 112 in a first direction X and/or a second direction Y, spaced apart from one another.

The first semiconductor chip 114 may be electrically connected with the first substrate 112 by using a conductive pad (not shown) arranged on a lower portion of the first semiconductor chip 114.

Although FIG. 2 depicts that an upper surface of the first semiconductor chip 114 and an upper surface of the first substrate 112 are coplanar with each other, the present disclosure is not limited thereto. For example, in some other exemplary embodiments, the upper surface of the first semiconductor chip 114 may be formed to be at a lower vertical height (e.g., the third direction Z) than the upper surface of the first substrate 112.

The second solder ball 170 may be arranged on a lower surface of the first substrate 112. The second solder ball 170 may be in contact with a conductive terminal arranged on the lower surface of the first substrate 112. The second solder ball 170 may convexly protrude from the lower surface of the first substrate 112. The second solder ball 170 may be a part for electrical connection of the first substrate 112 with another external element. The second solder ball 170 may be a plurality of solder balls 170.

The second solder ball 170 may include at least one of, for example, tin (Sn), lead (Pb), nickel (Ni), gold (Au), silver (Ag), copper (Cu), bismuth (Bi), and a combination thereof, although the present disclosure is not limited thereto.

The first molding layer 116 may be arranged to cover the first substrate 112 and the first semiconductor chip 114.

Although FIG. 2 depicts that a sidewall of the first semiconductor chip 114 is in contact with the first substrate 112, the present disclosure is not limited thereto. For example, in some other exemplary embodiments, the sidewall of the first semiconductor chip 114 may be spaced apart from the first substrate 112, and in this case, the first molding layer 116 may be arranged between the sidewall of the first semiconductor chip 114 and the first substrate 112.

The first molding layer 116 may be formed with, for example, silicon-based material, thermosetting material, thermoplastic material, UV processed material, or etc. Further, the first molding layer 116 may be formed with polymer such as resin, for example, epoxy molding compound (EMC).

The second package 120 may be arranged on the first package 110. The second package 120 may include a second substrate 122, a second semiconductor chip 124, a second molding layer 126, and a bonding wire 128.

The second substrate 122 may be, for example, a printed circuit board (PCB) or a ceramic substrate. However, the present disclosure is not limited thereto.

When the second substrate 122 is a PCB, the second substrate 122 may include at least one material selected from phenol resin, epoxy resin, and polyimide. For example, the second substrate 122 may include at least one material selected from FR4, tetrafunctional epoxy, polyphenylene ether, epoxy/polyphenylene oxide, bismaleimide triazine (BT), thermount, cyanate ester, polyimide, and liquid crystal polymer. A surface of the second substrate 122 may be covered by solder-resist, although the present disclosure is not limited thereto.

The second semiconductor chip 124 may be arranged on the second substrate 122. The second semiconductor chip 124 may be, for example, a semiconductor memory chip. The second semiconductor chip 124 may be, for example, a volatile memory semiconductor chip such as a dynamic random access memory (DRAM) or a static random access memory (SRAM) or a nonvolatile memory semiconductor chip such as a phase-change random access memory (PRAM), a magnetoresistive random access memory (MRAM), a ferroelectric random access memory (FeRAM), or a resistive random access memory (RRAM). However, the present disclosure is not limited thereto.

The second semiconductor chip 124 may be electrically connected with the second substrate 122 through the bonding wire 128. However, the present disclosure is not limited thereto. For example, in some other exemplary embodiments, the second semiconductor chip 124 may be electrically connected with the second substrate 122 by using a solder ball arranged between the second semiconductor chip 124 and the second substrate 122.

The second molding layer 126 may be arranged to cover the second substrate 122 and the second semiconductor chip 124.

The second molding layer 126 may be formed with, for example, silicon-based material, thermosetting material, thermoplastic material, UV processed material, or etc. Further, the first molding layer 116 may be formed with polymer such as resin, for example, epoxy molding compound (EMC).

The third substrate 130 may be arranged between the first package 110 and the second package 120 to be in contact with the first molding layer 116.

The third substrate 130 may be, for example, a printed circuit board (PCB) or a ceramic substrate. However, the present disclosure is not limited thereto.

When the third substrate 130 is a PCB, the third substrate 130 may include at least one material selected from phenol resin, epoxy resin, and polyimide. For example, the first substrate 112 may include at least one material selected from FR4, tetrafunctional epoxy, polyphenylene ether, epoxy/polyphenylene oxide, bismaleimide triazine (BT), thermount, cyanate ester, polyimide, and liquid crystal polymer.

The third substrate 130 may be electrically connected with the first package 110 through a via penetrating through the first package 110.

The first solder balls 140 may be arranged between the third substrate 130 and the second package 120 to electrically connect the third substrate 130 and the second package 120. As shown in FIG. 1, a plurality of first solder balls 140 may be arranged along a border region of the third substrate 130. In some embodiments, for example, the first solder balls 140 may be arranged along an entire perimeter region of the third substrate 130.

The first solder balls 140 may include at least one of, for example, tin (Sn), lead (Pb), nickel (Ni), gold (Au), silver (Ag), copper (Cu), bismuth (Bi), and a combination thereof, although the present disclosure is not limited thereto.

The supporter layer 160 may be arranged between the third substrate 130 and the second package 120. As shown in FIG. 1, the supporter layer 160 may be spaced apart from the first solder balls 140 in the first direction X and the second direction Y, and may be arranged on a center region of the third substrate 130. For example, when the first solder balls 140 are arranged around the perimeter of the third substrate 130, the supporter layer 160 may be located in the center region of the third substrate 130 and may be surrounded by the first solder balls 140.

As shown in FIG. 1, the supporter layer 160 may be spaced apart from the first solder balls 140, and may be arranged on the center region of the third substrate 130. Although FIG. 1 depicts that the shape of the supporter layer 160 on the X-Y plane is rectangular, this is for convenience of explanation, and the present disclosure is not limited thereto. For example, in some other exemplary embodiments, the supporter layer 160 may have other shapes such as a circular shape on the X-Y plane.

A width W1 of the supporter layer 160 in the first direction X may be narrower than a width W2 of the first package 110 in the first direction X. In addition, the width W1 of the supporter layer 160 in the first direction X may be narrower than a width of the second package 120 in the first direction X. However, the present disclosure is not limited thereto. For example, in some other exemplary embodiments, the width W1 of the supporter layer 160 in the first direction X may be larger than the width of the second package 120 in the first direction X.

The supporter layer 160 may include a non-conductive material, for example, non-conductive paste (NCP). In this case, the supporter layer 160 may perform a function of an insulation layer.

However, the present disclosure is not limited thereto. For example, in some other exemplary embodiments, the supporter layer 160 may include at least one of conductive material, for example, thermal interface material, grease, and paste. In this case, the supporter layer 160 may dissipate heat generated from the second package 120.

The first dam 150 may be arranged between the third substrate 130 and the second package 120. For example, a top surface of the first dam 150 may contact a bottom surface of the second package 120, and a bottom surface of the first dam 150 may contact a top surface of the third substrate 130. The first dam 150 may be in direct contact with a sidewall of the supporter layer 160, and may be arranged to completely surround the sidewall of the supporter layer 160. As shown in FIG. 1, the first dam 150 may be arranged between the first solder balls 140 and the supporter layer 160, and may be arranged to be spaced apart from the first solder balls 140.

For example, when warpage of the third substrate 130 and warpage of the second package 120 are the same as shown in FIG. 2, a height of the first dam 150 in the third direction Z may be the same as a height H of the supporter layer 160 in the third direction Z.

However, the present disclosure is not limited thereto. For example, in some other exemplary embodiments, when the warpage of the third substrate 130 and the warpage of the second package 120 are different from each other, the height of the first dam 150 in the third direction Z may be different from the height H of the supporter layer 160 in the third direction Z.

The first dam 150 may include a non-conductive material, for example, polymer such as epoxy, etc. However, the present disclosure is not limited thereto.

In the semiconductor package according to some exemplary embodiments, the first dam 150 is arranged to completely surround the sidewall of the supporter layer 160, such that the supporter layer 160 can be arranged on an intended region.

Specifically, in the process of fabricating the semiconductor package according to some exemplary embodiments, the first dam 150 is formed and then the supporter layer 160 is formed within the first dam 150, such that the supporter layer 160 can be arranged on an intended region. For example, when viewed in cross-section, the supporter layer 160 may be formed between opposing sidewalls of the first dam 150. In addition, the supporter layer 160 can be prevented from bleeding or overflowing by using the first dam 150.

In the semiconductor package according to some exemplary embodiments, the first dam 150 and the supporter layer 160 are arranged between the first package 110 and the second package 120, such that structural strength of the semiconductor package can be reinforced. Accordingly, deformation of the semiconductor package can be suppressed from a stress generated in the process of packaging or testing the semiconductor package according to some exemplary embodiments.

Although FIG. 2 depicts that the first package 110, the second package 120, and the third substrate 130 are formed flat without warpage, this is for convenience of explanation and the present disclosure is not limited thereto.

For example, in some other exemplary embodiments, the first package 110, the second package 120, and the third substrate 130 may be formed convexly in the opposite direction of the third direction Z. In addition, in some other exemplary embodiments, the second package 120 may be formed convexly in the third direction Z, and the first package 110 and the third substrate 130 may be formed convexly in the opposite direction of the third direction Z.

Hereinbelow, a semiconductor package according to some other exemplary embodiments will be described with reference to FIG. 3 and FIG. 4. The difference from the semiconductor package illustrated in FIG. 1 and FIG. 2 will be highlighted.

Figure 3:
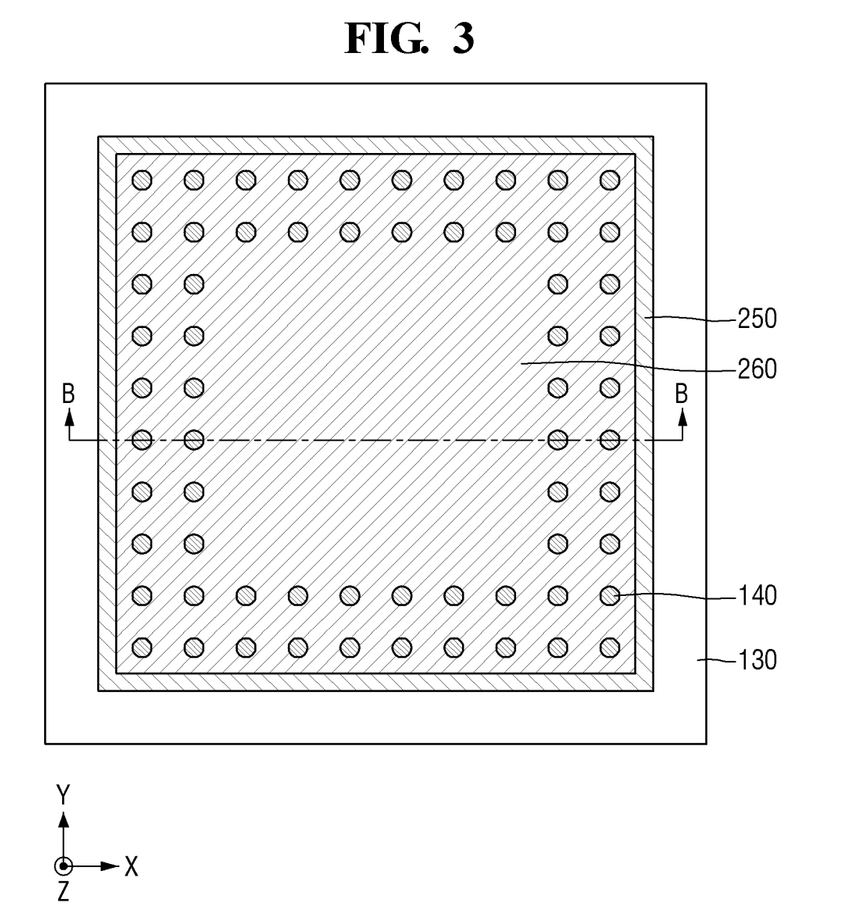
FIG. 3 is a top view provided to explain a semiconductor package according to some other exemplary embodiments.

FIG. 3 is a top view provided to explain a semiconductor package according to some other exemplary embodiments. FIG. 4 is a cross-sectional view taken on line B-B of FIG. 3. For convenience of explanation, a second package 120 is omitted from FIG. 3

Figure 4:
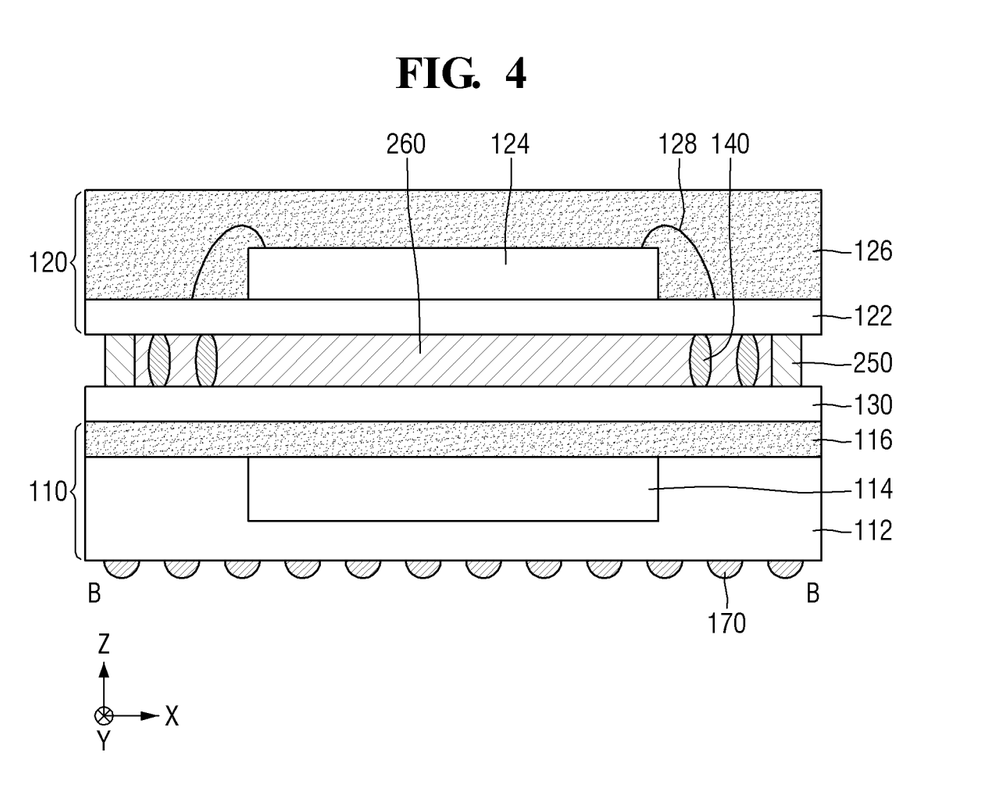
FIG. 4 is a cross-sectional view taken on line B-B of FIG. 3.

Referring to FIG. 3 and FIG. 4, the semiconductor package according to some other exemplary embodiments may have first solder balls 140 arranged inside a supporter layer 260.

Specifically, the first solder balls 140 may be arranged to penetrate through the supporter layer 260, and a first dam 250 may be arranged to completely surround a sidewall of the supporter layer 260. The first dam 250 may be arranged to be spaced apart from the first solder balls 140. In some embodiments, the first dam 250 may be formed along a perimeter region of the third substrate 130, and may surround the first solder balls 140.

The supporter layer 260 may include a non-conductive material, for example, non-conductive paste (NCP).

Hereinbelow, a semiconductor package according to some other exemplary embodiments will be described with reference to FIG. 5 and FIG. 6. The difference from the semiconductor package illustrated in FIG. 1 and FIG. 2 will be highlighted.

Figure 5:
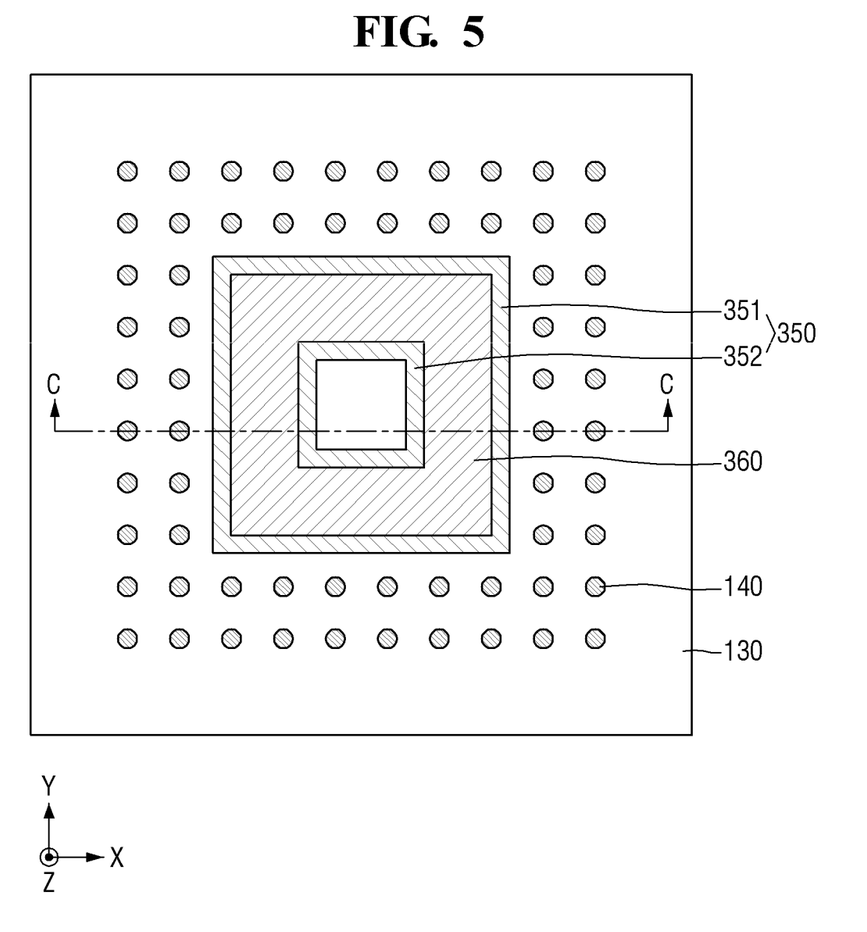
FIG. 5 is a top view provided to explain a semiconductor package according to some other exemplary embodiments.

FIG. 5 is a top view provided to explain a semiconductor package according to some other exemplary embodiments. FIG. 6 is a cross-sectional view taken on line C-C of FIG. 5. For convenience of explanation, a second package 120 is omitted from FIG. 5

Figure 6:
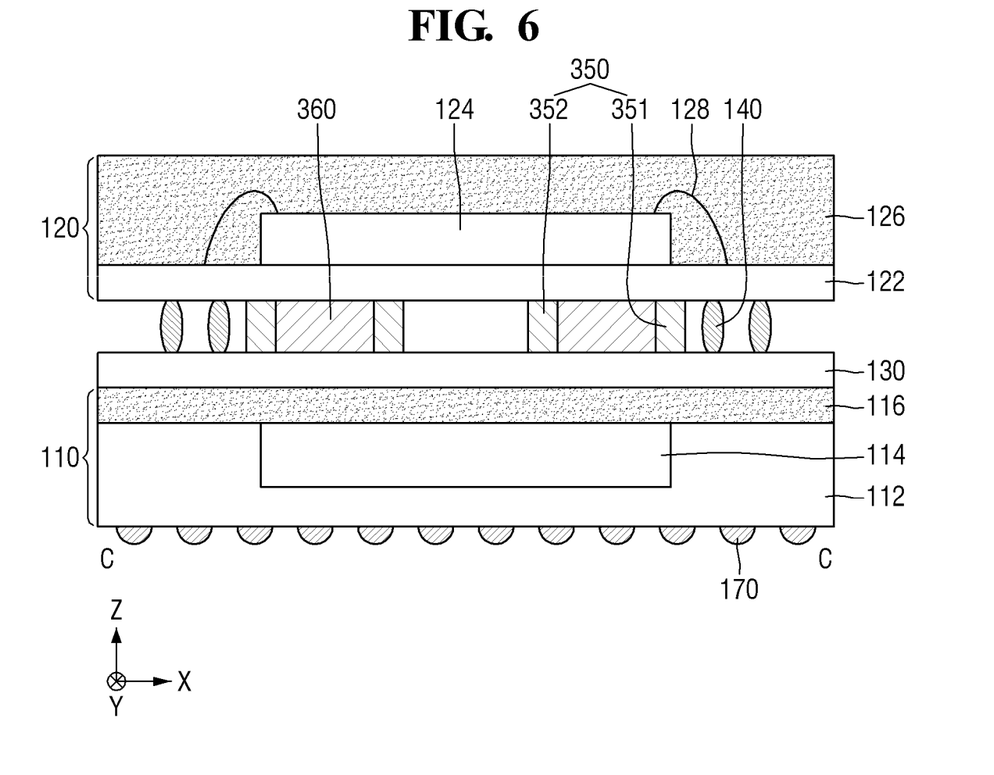
FIG. 6 is a cross-sectional view taken on line C-C of FIG. 5.

Referring to FIG. 5 and FIG. 6, the semiconductor package according to some other exemplary embodiments may have two dams 350 arranged between a third substrate 130 and a second package 120, and spaced apart from each other. A supporter layer 360 may be arranged between the two dams 350 spaced apart from each other. The two dams 350 may include a first dam 351 and a second dam 352.

Specifically, the supporter layer 360 may have a rectangular ring shape on the X-Y plane. However, the present disclosure is not limited thereto. For example, in some other exemplary embodiments, the supporter layer 360 may have other ring shapes such as a circular shape on the X-Y plane.

The first dam 351 may be arranged along an outer sidewall of the supporter layer 360 to completely surround the outer sidewall of the supporter layer 360. The first dam 351 may contact the outer sidewall of the supporter layer 360. The second dam 352 may be arranged along an inner sidewall of the supporter layer 360 to completely surround the inner sidewall of the supporter layer 360. The second dam 352 may contact the inner sidewall of the supporter layer 360. Segments of the first dam 351 and the second dam 352 may be parallel with one another. A cavity may be formed in a center region surrounded by the second dam 352. A shape of the cavity may correspond to the shape of the second dam 352.

Hereinbelow, a semiconductor package according to some other exemplary embodiments will be described with reference to FIG. 7 and FIG. 8. The difference from the semiconductor package illustrated in FIG. 1 and FIG. 2 will be highlighted.

Figure 7:
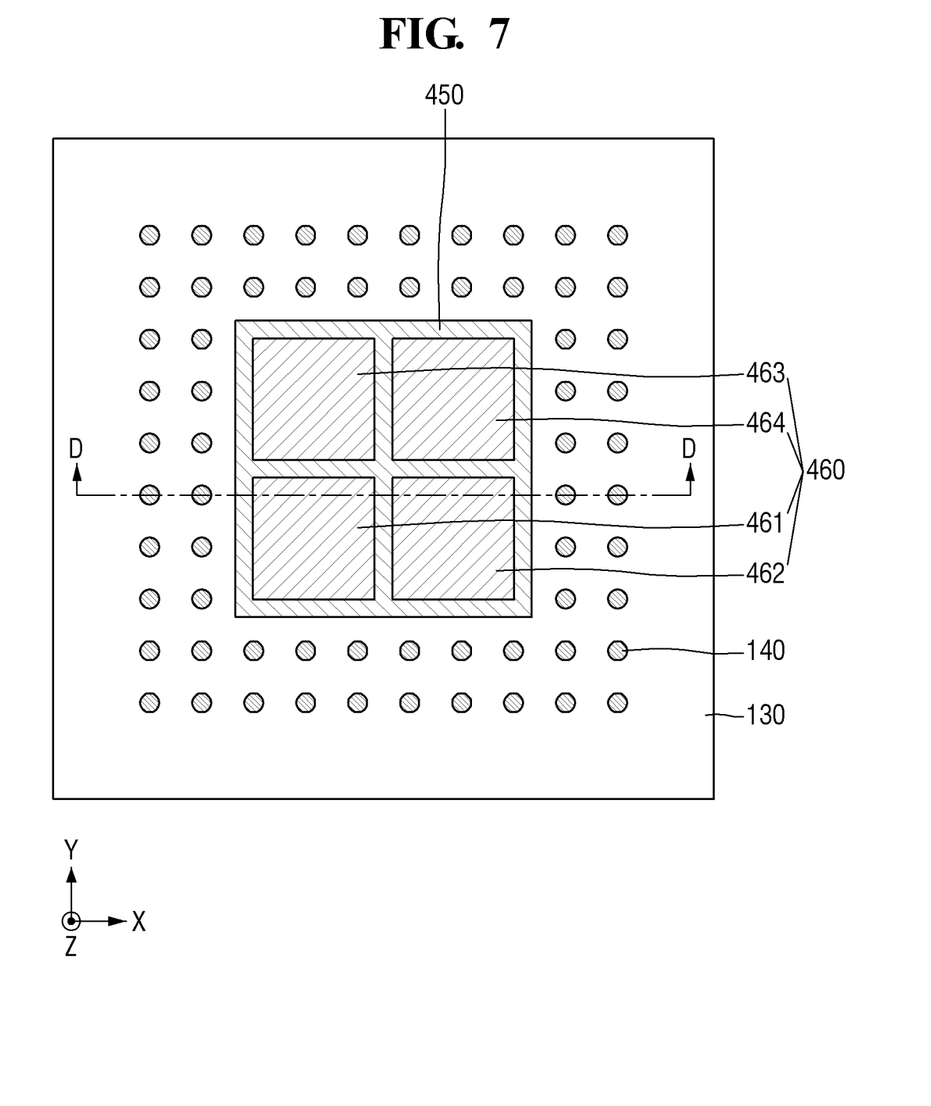
FIG. 7 is a top view provided to explain a semiconductor package according to some other exemplary embodiments.

FIG. 7 is a top view provided to explain a semiconductor package according to some other exemplary embodiments. FIG. 8 is a cross-sectional view taken on line D-D of FIG. 7. For convenience of explanation, a second package 120 is omitted from FIG. 7

Figure 8:
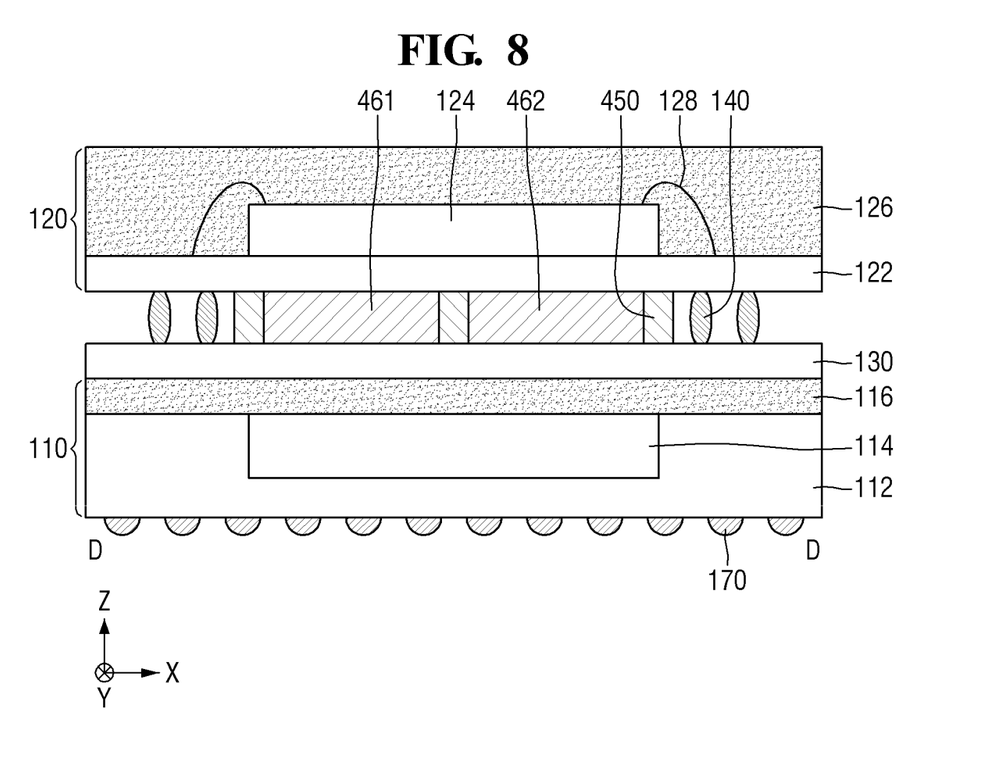
FIG. 8 is a cross-sectional view taken on line D-D of FIG. 7.

Referring to FIG. 7 and FIG. 8, the semiconductor package according to some other exemplary embodiments may include a supporter layer 460 including a plurality of sub supporter layers 461, 462, 463, 464 spaced apart from one another in the first direction X and the second direction Y perpendicular to the first direction X.

Specifically, the supporter layer 460 may include the first sub supporter layer 461 and the second sub supporter layer 462 spaced apart from each other in the first direction X, and the third sub supporter layer 463 and the fourth sub supporter layer 464 spaced apart from each other in the first direction X. In this case, the first sub supporter layer 461 may be spaced apart from the third sub supporter layer 463 in the second direction Y, and the second sub supporter layer 462 may be spaced apart from the fourth sub supporter layer 464 in the second direction Y.

Although FIG. 7 depicts that the four sub supporter layers 461, 462, 463, 464 are arranged on a third substrate 130, this is for convenience of explanation, and the number of sub supporter layers arranged on the third substrate 130 is not limited.

A first dam 450 may be arranged to completely surround respective sidewalls of each of the first to fourth sub supporter layers 461, 462, 463, 464. For example, the first dam 450 may be arranged between the respective first to fourth sub supporter layers 461, 462, 463, 464, and to surround the group of the first to fourth sub supporter layers 461, 462, 463, 464 (i.e., the supporter layer 460).

Hereinbelow, a semiconductor package according to some other exemplary embodiments will be described with reference to FIG. 9 and FIG. 10. The difference from the semiconductor package illustrated in FIG. 1 and FIG. 2 will be highlighted.

Figure 9:
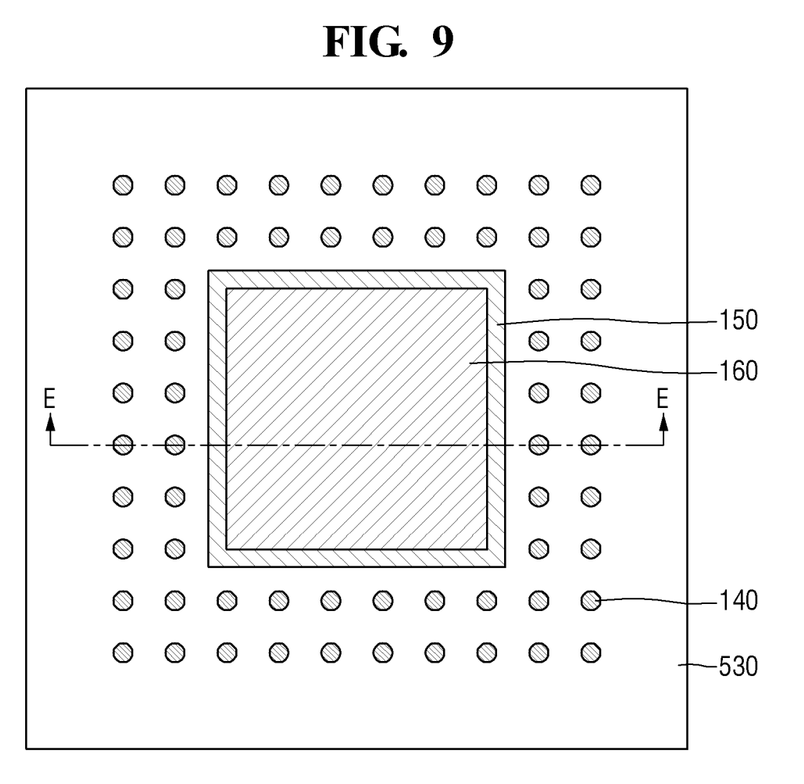
FIG. 9 is a top view provided to explain a semiconductor package according to some other exemplary embodiments.

FIG. 9 is a top view provided to explain a semiconductor package according to some other exemplary embodiments. FIG. 10 is a cross-sectional view taken on line E-E of FIG. 9. For convenience of explanation, a second package 120 is omitted from FIG. 9.

Figure 10:
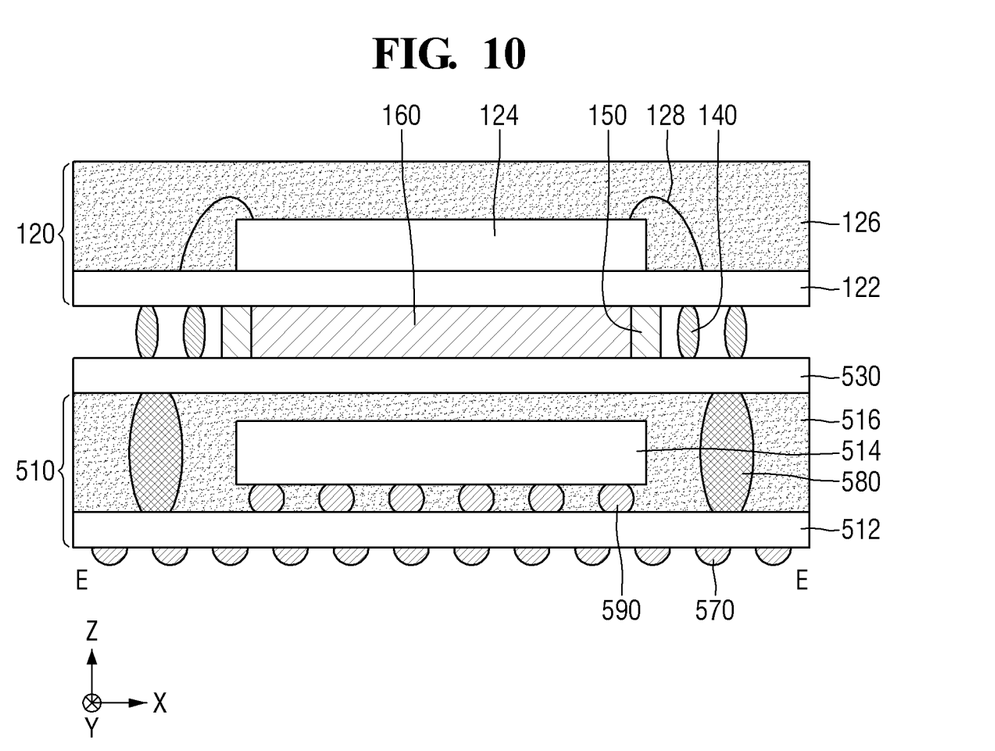
FIG. 10 is a cross-sectional view taken on line E-E of FIG. 9.

Referring to FIG. 9 and FIG. 10, the semiconductor package according to some other exemplary embodiments may include a first package 510 and an interposer 530.

The first package 510 may include a first substrate 512, a first semiconductor chip 514, a first molding layer 516, second solder balls 570, third solder balls 580, and fourth solder balls 590.

The first substrate 512 may be, for example, a printed circuit board (PCB) or a ceramic substrate. However, the present disclosure is not limited thereto.

The second solder balls 570 may be arranged on a lower surface of the first substrate 512. Each of the second solder balls 570 may be in contact with a conductive terminal arranged on the lower surface of the first substrate 512. The second solder balls 570 may convexly protrude from the lower surface of the first substrate 512. The second solder balls 570 may be a part for electrical connection of the first substrate 512 with another external element.

The first semiconductor chip 514 may be arranged on the first substrate 512. The first semiconductor chip 514 may be electrically connected with the first substrate 512 by using the fourth solder balls 590 arranged between the first semiconductor chip 514 and the first substrate 512. However, the present disclosure is not limited thereto. For example, in some other exemplary embodiments, the first semiconductor chip 514 may be electrically connected with the first substrate 512 through a bonding wire.

Although FIG. 10 depicts that one semiconductor chip is arranged on the first substrate 512, this is for convenience of explanation, and the present disclosure is not limited thereto. For example, in some other exemplary embodiments, two or more semiconductor chips may be stacked in the third direction Z. For example, in some other exemplary embodiments, two or more semiconductor chips may be arranged to be spaced apart from one another in the first direction X or the second direction Y.

The third solder balls 580 may be arranged between the first substrate 512 and the interposer 530. Specifically, the third solder balls 580 may be arranged between the first substrate 512 and the interposer 530 to be spaced apart from a side surface of the first semiconductor chip 513.

The third solder balls 580 may be arranged to be directly in contact with the first substrate 512 and the interposer 530, respectively. Specifically, each of the third solder balls 580 may be in contact with a conductive terminal arranged on an upper surface of the first substrate 512. In addition, each of the third solder balls 580 may be in contact with a conductive terminal arranged on a lower surface of the interposer 530. The third solder balls 580 may electrically connect the first substrate 512 and the interposer 530.

The third solder balls 580 may include, for example, tin (Sn), indium (In), bismuth (Bi), antimony (Sb), copper (Cu), silver (Ag), zinc (Zn), lead (Pb), and a combination thereof, although the present disclosure is not limited thereto.

A height of the third solder balls 580 in the third direction Z may be higher than a height of the first semiconductor chip 514 in the third direction Z.

The first molding layer 516 may be arranged between the upper surface of the first substrate 512 and the lower surface of the interposer 530.

Specifically, the first molding layer 516 may be arranged on the first substrate 512 to cover the upper surface of the first substrate 512, side surfaces of the third solder balls 580, side surfaces of the fourth solder balls 590, the first semiconductor chip 514, and the lower surface of the interposer 530. In some embodiments, a top surface of the first molding layer 516 may be coplanar with a top surface of the third solder balls 580, and a bottom surface of the first molding layer 516 may be coplanar with a bottom surface of the third solder balls 580.

The first molding layer 516 may be formed with, for example, silicon-based material, thermosetting material, thermoplastic material, UV processed material, or etc. Further, the first molding layer 116 may be formed with polymer such as resin, for example, epoxy molding compound (EMC).

The interposer 530 may be arranged between the first package 510 and the second package 120 to be in contact with the first package 510. First solder balls 140, a first dam 150, and a supporter layer 160 may be arranged between the interposer 530 and the second package 120. The interposer 530 may be electrically connected with the second package 120 by using the first solder balls 140.

The interposer 530 may include at least one of silicon, glass, ceramic or plastic. However, the present disclosure is not limited thereto.

Exemplary embodiments according to the present disclosure were explained hereinabove with reference to the drawings attached, but it should be understood that the present disclosure is not limited to the aforementioned exemplary embodiments, but may be fabricated in various different forms, and may be implemented by a person skilled in the art in other specific forms without altering the technical concept or essential characteristics of the present disclosure. Accordingly, it will be understood that the exemplary embodiments described above are only illustrative, and should not be construed as limiting.

What is claimed is:

1. A semiconductor package comprising:
   a first package comprising a first substrate and a first semiconductor chip;
   a second package arranged on the first package, the second package comprising a second substrate and a second semiconductor chip;
   a first solder ball and a supporter layer arranged between the first package and the second package; and
   a dam arranged between the first package and the second package, the dam being in contact with sidewalls of the supporter layer,
   wherein the dam completely surrounds the supporter layer, when viewed in plan view, and
   wherein a bottom surface of the first solder ball is at a higher vertical level than a top surface of the first semiconductor chip.

2. The semiconductor package of claim 1, further comprising:
   a third substrate arranged between the first package and the supporter layer,
   wherein the first semiconductor chip is arranged to be buried in the first substrate.

3. The semiconductor package of claim 2, further comprising:
   a molding layer arranged between the first semiconductor chip and the third substrate.

4. The semiconductor package of claim 1, further comprising:
   an interposer arranged between the first package and the supporter layer; and
   a second solder ball arranged between the first substrate and the interposer to electrically connect between the first substrate and the interposer.

5. The semiconductor package of claim 1, wherein the dam is arranged between the first solder ball and the supporter layer, and the dam is spaced apart from the first solder ball.

6. The semiconductor package of claim 1, wherein the first solder ball is arranged in the supporter layer.

7. The semiconductor package of claim 1, wherein the dam comprises a first dam arranged along an outer sidewall of the supporter layer, and a second dam arranged along an inner sidewall of the supporter layer.

8. The semiconductor package of claim 1, wherein the supporter layer comprises a plurality of sub supporter layers spaced apart from one another in a first direction and in a second direction perpendicular to the first direction.

9. The semiconductor package of claim 1, wherein a width of the supporter layer is narrower than a width of the first package and a width of the second package.

10. The semiconductor package of claim 1, wherein the dam comprises a non-conductive material, and the supporter layer comprises a conductive material.

11. A semiconductor package comprising:
    a first package comprising a first semiconductor chip;
    a substrate arranged on the first package;
    a second package arranged on the substrate, the second package comprising a second semiconductor chip;
    a supporter layer arranged between the substrate and the second package; and
    a dam arranged between the substrate and the second package, the dam being in contact with a sidewall of the supporter layer, and the dam comprising a non-conductive material,
    wherein the dam completely surrounds the supporter layer, when viewed in plan view.

12. The semiconductor package of claim 11, further comprising:
    a solder ball arranged between the substrate and the second package, wherein the dam is arranged between the solder ball and the supporter layer, and the dam is spaced apart from the solder ball.

13. The semiconductor package of claim 11, further comprising:

a solder ball arranged between the substrate and the second package, wherein the solder ball is arranged in the supporter layer.

14. The semiconductor package of claim 11, wherein the dam comprises a first dam arranged along an outer sidewall of the supporter layer, and a second dam arranged along an inner sidewall of the supporter layer.

15. The semiconductor package of claim 11, wherein a height of the supporter layer is the same as a height of the dam.

16. The semiconductor package of claim 11, wherein the supporter layer comprises a non-conductive material.

17. A semiconductor package comprising:

a first package comprising a first substrate and a first semiconductor chip arranged on the first substrate;

a second substrate arranged on the first package;

a supporter layer arranged on the second substrate, the supporter layer having a width narrower than a width of the first package;

a dam arranged on the second substrate, the dam being in contact with a sidewall of the supporter layer, and the dam completely surrounding the supporter layer, when viewed in plan view; and a solder ball arranged on the second substrate and the solder ball spaced apart from the dam.

18. The semiconductor package of claim 17, further comprising:

a second package arranged on the supporter layer, the second package having a width larger than the width of the supporter layer, and the second package comprising a second semiconductor chip.

19. The semiconductor package of claim 17, wherein the supporter layer comprises a plurality of sub supporter layers spaced apart from one another in a first direction and in a second direction perpendicular to the first direction.

20. The semiconductor package of claim 17, wherein the first semiconductor chip is arranged to be buried in the first substrate.

* * * * *